United States Patent [19]

Namikawa et al.

[11] Patent Number: 5,632,811
[45] Date of Patent: May 27, 1997

[54] METHOD OF RETAINING MELT OF OXIDE

[75] Inventors: Yasuo Namikawa, Osaka; Yasuji Yamada, Tokyo; Satoshi Koyama, Tokyo; Yuh Shiohara, Tokyo; Shoji Tanaka, Tokyo, all of Japan

[73] Assignees: Sumitomo Electric Industries, Ltd.; International Superconductivity Technology Center, both of Japan

[21] Appl. No.: 420,519

[22] Filed: Apr. 12, 1995

[30] Foreign Application Priority Data

Apr. 14, 1994 [JP] Japan ................... 6-075792

[51] Int. Cl.$^6$ ........................... C30B 29/16
[52] U.S. Cl. ..................... 117/1; 117/2; 117/36
[58] Field of Search .................. 117/1, 2, 36, 64; 423/263

[56] References Cited

U.S. PATENT DOCUMENTS 5,078,830  1/1992  Shirata et al. .

FOREIGN PATENT DOCUMENTS

A 0 573 193  12/1993  European Pat. Off. .

OTHER PUBLICATIONS

Yamada et al., "Continuous crystal growth of $YBa_2Cu_3O_{7-x}$ by the modified topseeded crystal pulling method", Physica C, vol. 217, 1993, pp. 182–188.

Gagnon et al., "Growth of $YBa_2Cu_3O_{7-x}$ crystals in thoria crucibles: twinning and optical effects", Journal of Crystal Growth, vol. 121, No. 4, Aug. 1992, pp. 559–565.

Barilo et al., "Growth of bulk single crystals of $YBa_2Cu_3O_{7-\delta}$ from a new type of crucible", Journal of Crystal Growth, vol. 119, No. 3/4, May 1992, pp. 403–406.

Lombardo et al., "Growth of $Bi_2Sr_2CaCu_2O_8$ single crystals using MgO crucibles", Journal of Crystal Growth, vol. 118, No. 3/4, Apr. 1992, pp. 483–489.

Dembinsky et al., "$YBa_2Cu_3O_{7-x}$ Single–crystal Growth by a New '$Y_2O_3$ Consumable Crucible' Technique", Materials Science and Engineering, vol. B5, No. 3, Feb. 1990, pp. 345–349.

Patent Abstracts of Japan, vol. 13, No. 394 (C–631), Aug. 31, 1989 and JP–A–01 138 191, May 31, 1989.

IBM Technical Disclosure Bulletin, vol. 33, No. 2, Jul. 1990, p. 95.

(List continued on next page.)

*Primary Examiner*—R. Bruce Breneman
*Assistant Examiner*—Felisa Garrett
*Attorney, Agent, or Firm*—Pennie & Edmonds

[57] ABSTRACT

In order to stably retain an oxide-based melt consisting essentially of yttrium or a lanthanoid element, barium, copper and oxygen at a prescribed temperature with no impurity contamination thereby preparing a large oxide crystal of high quality from the melt, an oxide melt consisting essentially of yttrium or a lanthanoid element, barium, copper and oxygen is stored in a first crucible, which in turn is held in a second crucible. The first crucible is made of a material which is an oxide of at least one element forming the melt having a melting point higher by at least 10° C. than a melt retention temperature and causing no structural phase transition up to a temperature higher by 10° C. than the aforementioned prescribed temperature, with solubility of not more than 5 atomic percent with respect to the melt in a temperature range from the room temperature to a temperature higher by 10° C. than the melt retention temperature. The second crucible is made of a material substantially causing neither melting nor chemical reaction with respect to the oxide-based melt, which can retain the melt more stably than the first material. Even if the melt overflows the first crucible, this overflow is suppressed by the second crucible. It is possible to prepare a crystal of an oxide superconductor such as $YBa_2Cu_3O_{7-x}$ ($0 \leq X \leq 1$) by the pulling method from the melt which is stored in the first crucible.

11 Claims, 5 Drawing Sheets

OTHER PUBLICATIONS

Sen et al., "Creep of CuO–BaO Melts Along the Container Wall", Materials Letters, vol. 7, No. 12, Mar. 1989, pp. 433–436.

Watanabe "An approach to the growth of $YBa_2Cu_3O_{7-x}$ single crystals by the flux method. II" published in 1991 by Journal of Crystal Growth 114.

Elizabeth et al. "Growth and extraction of flux free YBCO crystals" published in 1992 by Journal of Crystal Growth 121.

Yamada et al. "Continuous crystal growth of Y 123 by the modified top–seeded solution growth" published in 1993 by the 54th Scientific Lecture Meeting of the Japan Society of Applied Physics.

Yamada et al. "Enlargement of high temperature superconductor YBCO, single crystal" published in 1993 by Applied Physics.

"Double Crucible Method for the Growth of large oxide single crystals"; Wang, et al., *J. Cryst. Growth* (1990), 106 (2–3), pp. 483–486.

METHOD OF RETAINING MELT OF OXIDE

BACKGROUND OF THE INVENTION

1. Field of the Invention

The present invention relates to melt retention and crystal growth with respect to an oxide, and more particularly, it relates to methods of melt retention and crystal preparation in relation to a yttrium-based or lanthanoid element-based oxide superconductor.

2. Description of the Background Art

A Y-based oxide superconductor ($YBa_2Cu_3O_{7-x}$, hereinafter referred to as Y123) is watched with interest as a high temperature superconducting material having a critical temperature of 90K. Establishment of a technique for preparing a large-sized single crystal substrate is desired for preparation of a superconducting electron device thereof. However, it is considerably difficult to obtain a large-sized single crystal of Y123, since Y123 results from peritectic solidification reaction and it is difficult to retain a BaO—CuO-based melt serving as a flux in a crucible due to high reactivity.

In general, a flux method is suitable for preparing a crystal by peritectic solidification reaction. Also in preparation of a Y123 crystal, therefore, crystal growth by the flux method has been mainly attempted with employment of a crucible of alumina or platinum and a flux of a BaO—CuO-based melt in general. In the flux method, however, it is considerably difficult to stably prepare a large crystal since a number of crystal nuclei are formed in the melt with no controllability. As hereinabove described, it also comes into question that the reactivity of the BaO—CuO-based melt is so high that it is difficult to retain the same in a crucible (references: J. Crystal Growth, 114, 1991, p. 269 by K. Watanabe and J. Crystal Growth, 121, 1992, p. 531 by S. Elizabeth et al.).

On the other hand, the crystal pulling method which is employed for preparing a large single crystal of a semiconductor such as GaAs is suitable for preparing a large single crystal from a melt with excellent controllability. However, it is difficult to apply the pulling method to preparation of Y123 due to the aforementioned problems of peritectic solidification and the reactivity of the melt.

When a Y123 single crystal is grown by the pulling method, retention of the BaO—CuO melt in the crucible comes into question in the first place. One of the largest problems to be solved is related to the type of the material for forming the crucible for storing the melt. A crucible of a noble metal such as platinum is unavailable since its reactivity with the melt is so high that the crucible may be pierced. When the crucible is made of general fire-resistant ceramics, on the other hand, the melt exudes from the crucible or creeps up along the crucible to overflow the same, and hence its volume is extremely reduced.

On the other hand, a crucible which is prepared from an MgO (magnesia) single crystal or a sufficiently dense MgO sintered body having high bulk density can retain a BaO—CuO-based melt. In such a crucible consisting essentially of MgO, it is possible to stably retain the melt with no piercing of the crucible and neither exudation nor overflow of the melt. In this case, however, Mg gradually contaminates the melt with time, to disadvantageously deteriorate characteristics of the crystal as prepared.

Yamada et al. succeeded in continuously growing a Y123 single crystal through the pulling method by employing a yttria crucible and making a $Y_2BaCuO_5$ phase coexistent with the melt as a solute supply source (reference: the 54th Scientific Lecture Meeting of the Japan Society of Applied Physics, 1993, 29P-ZK-7, Yamada et al., and Physica C 217 (1993) 182–188, Y. Yamada and Y. Shiohara). It is possible to avoid impurity contamination by employing a crucible consisting essentially of a $Y_2O_3$ (yttria) sintered body. However, the yttria crucible has such a disadvantage that the melt overflows the same. FIG. 6 typically illustrates an overflowing state of a melt 63 in employment of a $Y_2O_3$ crucible 61. In the state shown in FIG. 6, it is impossible to continue the crystal growth stably over a long period. Applied Physics, Vol. 62, No. 5 (1993) pp. 459 to 462 by Yamada and Shiohara describes that a BaO—CuO melt creeps up along walls of a yttria crucible and overflows the same due to extremely high wettability and reactivity, leading to lowering of the liquid level. This literature also describes that a method of retaining the melt is an important subject for maintaining a constant growing state and implementing long-time growth.

There has hitherto been known no crucible which can simultaneously satisfy stable retaining of a mold and prevention of impurity contamination. Thus, it has been difficult to prepare a large crystal of high quality.

SUMMARY OF THE INVENTION

The present invention has been proposed in order to solve the aforementioned problems, and objects thereof are to stably retain an oxide raw material melt with no impurity contamination and to thereby prepare a large yttrium-based or lanthanoid-based oxide crystal of high quality.

A method of retaining a melt of an oxide according to the present invention is adapted to retain an oxide-based melt consisting essentially of R (R: yttrium or a lanthanoid element), barium (Ba), copper (Cu) and oxygen (O) at a prescribed temperature, and comprises the steps of storing the oxide-based melt in a first crucible part which consists essentially of a first material, and holding the first crucible part in a second crucible part which consists essentially of a second material at least while storing the melt. According to this method, the first material consists essentially of a material which is an oxide of at least one element selected from the group consisting of the aforementioned R, barium and copper, having a melting point which is higher by at least 10° C. than the aforementioned prescribed temperature and causing no structural phase transition in a temperature range from the room temperature to a temperature which is higher by 10° C. than the aforementioned prescribed temperature, with solubility of not more than 10 atomic percent (or mole percent), preferably not more than 5 atomic percent (or mole percent) with respect to the melt in the temperature range from the room temperature to the temperature which is higher by 10° C. than the aforementioned prescribed temperature. On the other hand, the second material consists essentially of a material substantially causing neither melting nor chemical reaction with respect to the oxide-based melt, which can retain the melt more stably than the first material. Movement of the melt is suppressed by the second crucible part.

With employment of the aforementioned melt retention method, a method of preparing an oxide crystal is provided. This method is adapted to prepare an oxide crystal having a structure of $RBa_2Cu_3O_{7-x}$ ($0 \leq X \leq 1$) from an oxide-based melt consisting essentially of R (R: yttrium or a lanthanoid element), barium, copper and oxygen, and comprises the steps of storing the oxide-based melt in a first crucible part which consists essentially of a first material, holding the first crucible part in a second crucible part which consists essentially of a second material at least while storing the melt, and bringing a seed crystal which is provided on a forward end of a pulling shaft into contact with the melt stored in the first crucible part while suppressing movement of the melt by the second crucible part and thereafter pulling up the oxide crystal from the melt by the pulling shaft which is rotated. According to this method, the first material consists essentially of a material which is an oxide of at least one element selected from the group consisting of R, barium and copper, having a melting point which is higher by at least 10° C. than the aforementioned prescribed temperature and causing no structural phase transition in a temperature range from the room temperature to a temperature which is higher by 10° C. than the aforementioned prescribed temperature, with solubility of not more than 10 atomic percent (or mole percent), preferably not more than 5 atomic percent (or mole percent) with respect to the melt in the temperature range from the room temperature to the temperature which is higher by 10° C. than the aforementioned prescribed temperature, as hereinabove described. On the other hand, the second material consists essentially of a material substantially causing neither melting nor chemical reaction with respect to the oxide-based melt, which can retain the melt more stably than the first material. This method is applicable to preparation of an oxide superconductor crystal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
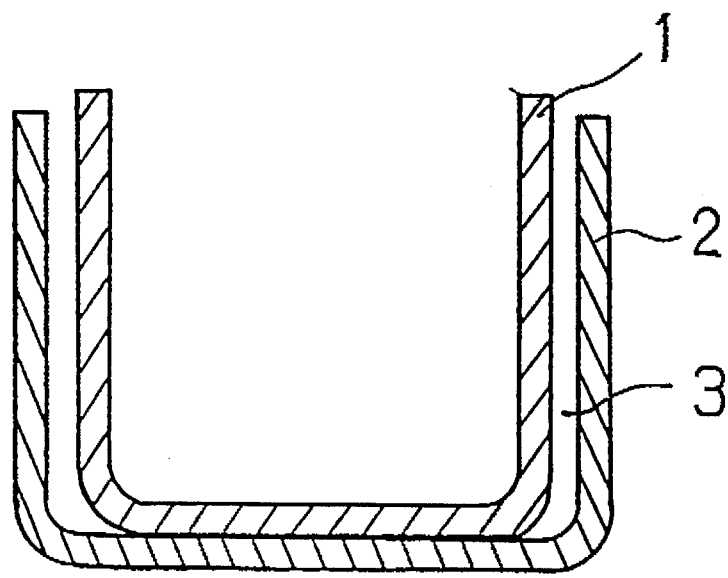
FIG. 1 is a sectional view showing a concrete example of a crucible for retaining a melt according to the present invention.

An important feature of the present invention resides in that a first crucible part for directly retaining a melt is held in a second crucible part. As shown in FIG. 1, these crucibles can be brought into the structure of a double crucible, for example. An inner crucible 1 which is the first crucible part is stored in an outer crucible 2 which is the second crucible part. These crucibles 1 and 2 can be provided independently of each other, and are arranged as shown in FIG. 1. The outer crucible 2 is provided to enclose the inner crucible 1. In this case, a clearance 3 is provided between the two crucibles 1 and 2. This clearance 3 is so provided that the inner crucible 1 can expand to some extent with no inhibition by the outer crucible 2. For example, the space between an outer side surface of the inner crucible 1 and an inner side surface of the outer crucible 2 can be set at 1 mm to 10 mm, more preferably 2 mm to 5 mm. When the thermal expansion coefficients of the two crucibles 1 and 2 are considerably different from each other, the outer crucible 2 may be broken by expansion of the inner crucible 1 etc. if the space is not more than 1 mm. If the space exceeds 10 mm, on the other hand, the volume of a melt flowing out from the inner crucible 1 is so increased that the liquid level of the melt which is stored in the inner crucible 1 is excessively lowered.

Figure 2:
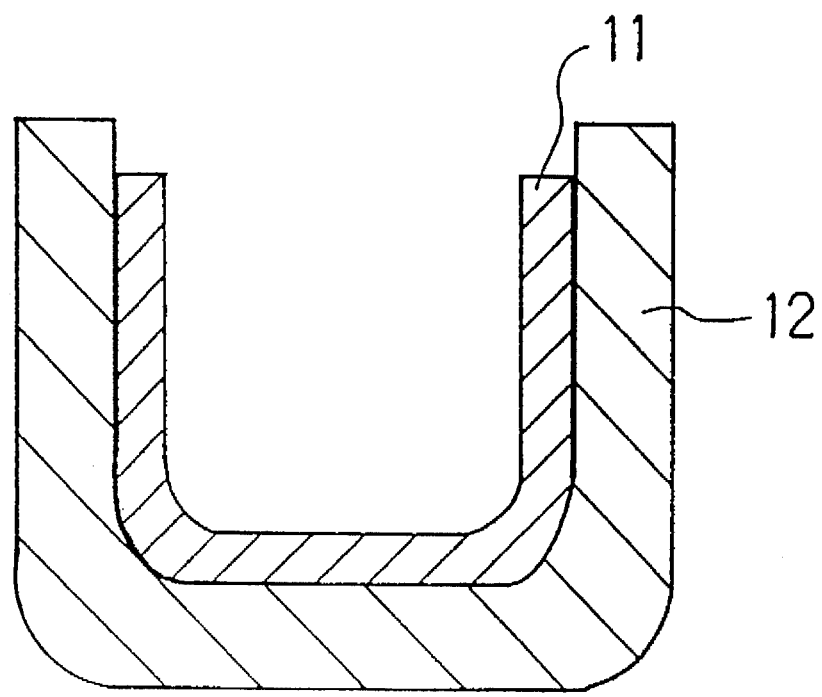
FIG. 2 is a sectional view showing another concrete example of the crucible for retaining a melt according to the present invention.

Alternatively, it is possible to form a double crucible with no such clearance provided between two crucible parts. As shown in FIG. 2, for example, a second crucible part 12 may be in close contact with outer surfaces of a first crucible part 11. Further, these parts may be provided integrally with each other. In such a structure, the second crucible part 12 preferably has a thermal expansion coefficient which is close to that of the first crucible part 11. Therefore, it is possible to prepare the second crucible part 12 from a composite material whose composition is gradually changed from the inner side toward the outer side (or from the outer side toward the inner side), for example. In this case, the composition of the second crucible part 12 may be gradually approached toward that of the first crucible part 11.

According to the present invention, the first crucible part can be preferably formed by an oxide sintered body containing an element R, i.e., a sintered body of yttrium oxide ($Y_2O_3$), samarium oxide ($Sm_2O_3$) or $PrBaO_3$ in more concrete terms, for example.

A method of selecting a first material for forming the first crucible part is now described with reference to a case of retaining a melt of an oxide which consists essentially of Y, Ba and Cu in mole ratios of 1:60:100 at 1020° C. First, an oxide of at least one element among those forming the oxide is selected, in order to prevent the melt from impurity contamination from the inner crucible. In other words, an oxide consisting essentially of a combination of one, two or three of the three elements Y, Ba and Cu is selected. For example, such an oxide is selected from $Y_2O_3$, BaO, CuO, $BaCuO_2$, $Ba_2CuO_3$, $Y_2Cu_2O_5$ and $Y_2BaCuO_5$. On the other hand, the substance forming the inner crucible must stably keep its shape for serving as a crucible at least up to a melt retention temperature. Therefore, it is necessary to select a substance having a melting point which is higher by at least 10° C. than the melt retention temperature and causing no structural phase transition in a temperature range from the room temperature to a temperature which is higher by 10° C. than the melt retention temperature. If the melt retention temperature is 1020° C., the first material must be a substance having a melting point of at least 1030° C. and causing no structural phase transition between the room temperature and 1030° C. Among the aforementioned substances, $BaCuO_2$ and $Ba_2CuO_3$ have melting points of about 1016° C. and about 920° C. respectively, and hence these substances cannot be employed as the first material. Further, the first material must not be dissolved in the melt. Therefore, the first material must have solubility of not more than 10 percent, preferably not more than 5 percent, with respect to the melt in the temperature range from the room temperature to the temperature which is higher by 10° C. than the melt retention temperature. In other words, the concentration of the component(s) of the first material which is dissolved in the melt must be suppressed to not more than 10 atomic percent, more preferably not more than 5 atomic percent. If the mole ratios of Y, Ba and Cu which are contained in the melt are 1:60:100, each of BaO, CuO and $Y_2Cu_2O_5$ has high solubility with respect to the melt of this composition. When the melt is retained in a crucible consisting essentially of such a substance, therefore, dissolution of the crucible material in the melt so progresses that the composition of the melt is extremely changed with time, to finally break the crucible itself. In order to retain an oxide of the aforementioned composition at 1020° C., therefore, $Y_2O_3$ or $Y_2BaCuO_3$ is employable as the first material. Either oxide is applicable to the crucible in principle, $Y_2O_3$ is more advantageous since the raw material is easy to obtain and this material can be readily molded into a crucible. A selection method which is similar to the above is applied to a melt of another composition.

In the present method of preparing an oxide crystal, it is also possible to select the first material substantially in a similar manner to the above. In a case of preparing a crystal having a structure of $YBa_2Cu_3O_{7-x}$, for example, the peritectic temperature of this substance is about 1010° C., and hence it is possible to employ a melt containing Y, Ba and Cu in mole ratios of about 1:60:100 for crystal growth with employment of BaO and CuO for forming the flux. Similarly to the aforementioned melt retention method, therefore, $Y_2O_3$ or $Y_2BaCuO_5$ is selected as the first material.

On the other hand, the second material for forming the second crucible in the present invention is prepared from a material substantially causing neither melting nor chemical reaction with respect to the melt. The second crucible part is maintained as such while the melt is retained therein, with no change of its solid shape resulting from melting or chemical reaction. Further, no melt creeps up along inner walls of the second crucible to overflow the same by chemical reaction, dissimilarly to the aforementioned conventional crucible. Thus, the expression "substantially causing neither melting nor chemical reaction" indicates that neither melting nor chemical reaction is caused in a range of keeping the solid shape of the crucible and causing no rise of the melt. In the second material, slight melting or chemical reaction is allowed so far as the solid shape of the second crucible part is kept and no rise of the melt is recognized.

While the second material is preferably insoluble in the melt, a material which is only slightly dissolved therein is also employable in the present invention. The concentration of the second material component which is dissolved in the melt is preferably not more than 1 atomic percent, and more preferably not more than 0.5 atomic percent. Therefore, the solubility of the second material with respect to the melt is preferably not more than 1 percent, and more preferably not more than 0.5 percent. Further, the second crucible is preferably made of a material allowing no penetration of the melt therein, while slight penetration may be caused in a range exerting no influence on retention of the melt. In relation to the present invention, the term "melting" indicates phase transition of a substance from a solid state into a liquid state, and the term "dissolution" indicates such a phenomenon that a gas, a liquid or a solid is mixed into a liquid to form a homogeneous liquid phase.

In the aforementioned viewpoint, magnesium oxide (MgO) is preferably employed as the second material. Further, the second crucible part is preferably formed by a single crystal or a sintered body of magnesium oxide. While an MgO single crystal is preferable in order to prevent penetration of the melt, an MgO sintered body is more preferable in a point that the same is easy to obtain. The sintered body tends to be porous depending on preparation conditions, and an excessively porous sintered body is unpreferable due to remarkable penetration of the melt. When an MgO sintered body is employed, therefore, its bulk density is preferably at least 95 percent. Such an MgO sintered body having bulk density of at least 95 percent is further suitable for the second crucible part due to suppression of penetration of the melt, and further effectively attains the object of the present invention.

When $Y_2O_3$ is employed as the first material in the present invention, $Y_2O_3$ causes chemical reaction with a melt consisting essentially of Y, Ba, Cu and O, for example, whereby the melt creeps up along the inner walls. However, the second material such as MgO, for example, causes substantially no reaction with the melt, and can retain the melt more stably than the first material. The crucible part consisting essentially of the second material suppresses lowering of the melt surface level resulting from movement of the melt such as overflow from the first crucible part, for example. The second crucible part further stably keeps the liquid level of the melt which is stored in the first crucible part. The second crucible part, which is made of the material capable of retaining the melt while further stabilizing the liquid level as compared with the first crucible, is prepared from a material which can stably maintain the liquid level of the melt without changing its solid shape for at least 100 hours, preferably at least 200 hours, and more preferably at least 250 hours. During this time, vertical change of the liquid level is suppressed to not more than 2 mm, more preferably not more than 1 mm, for example.

In the methods of retaining a melt and preparing an oxide crystal according to the present invention, the composition of the melt and the first and second materials can be combined with each other as follows, for example: When the oxide-based melt consists essentially of yttrium (Y), barium (Ba), copper (Cu) and oxygen (O), the first and second materials can be prepared from sintered bodies of yttrium oxide ($Y_2O_3$) and magnesium oxide (MgO) respectively. In this case, it is possible to prepare an oxide crystal having a structure of $YBa_2Cu_3O_{7-x}$ ($0 \leq X \leq 1$) by the pulling method. When the melt consists essentially of samarium (Sm), Ba, Cu and O, on the other hand, the first and second materials can be prepared from sintered bodies of samarium oxide ($Sm_2O_3$) and MgO respectively. In this case, it is possible to pull up an oxide crystal having a structure of $SmBa_2Cu_3O_{7-x}$ ($0 \leq X \leq 1$). When the melt consists essentially of praseodymium (Pr), Ba, Cu and O, further, the first and second materials can be prepared from sintered bodies of $PrBaO_3$ and MgO respectively. In this case, it is possible to pull up an oxide crystal having a structure of $PrBa_2Cu_3O_{7-x}$ ($0 \leq X \leq 1$). Thus, it is possible to prepare a crystal of an oxide superconductor according to the present invention.

In the present invention, heating/melting of the raw material, retention of the melt and preparation of the oxide crystal can be carried out under an atmosphere containing vapor of a material which is selected from the group consisting of silver, a silver alloy and a silver compound. As hereinafter described, the vapor of such a material, particularly that of silver, acts to suppress movement (downward movement) of the liquid level of the melt and dissolution of the crucible components in the melt. In order to supply this material, a material which is selected from the group consisting of silver, a silver alloy and a silver compound can be stored between the first crucible part (inner crucible) and the second crucible part (outer crucible).

In the present invention, further, the second crucible part holding the first crucible part is preferably supported by a member, such as a support post, for example, consisting essentially of a sintered body or a single crystal of magnesium oxide. This is because it is preferable to support the crucible by a material which is not reactive with the melt for stably retaining the melt when the same slightly penetrates from the second crucible. The second crucible is preferably in contact with only this support member.

When a crystal of a yttrium-based or lanthanoid element-based oxide superconductor is prepared in the present invention, it is possible to prepare a raw material melt for pulling up the raw material by employing a BaO—CuO melt as a flux and dissolving $Y_2BaCuO_5$, $Sm_2BaCuO_5$ or $PrBaO_3$ therein, for example.

According to the present invention, the melt is stored in the first crucible part which consists essentially of the first material. The first material brings no impurity contamination to the melt and stably keeps the shape for serving as a crucible while retaining the melt, due to the following properties:

(1) It consists essentially of an oxide of at least one element selected from the group consisting of R, barium and copper.

(2) It has a melting point which is higher by at least 10° C. than the temperature for retaining the melt.

(3) It causes no structural phase transition in a temperature range from the room temperature to a temperature which is higher by 10° C. than the temperature for retaining the melt.

(4) Its solubility with respect to the melt is not more than 10 percent, preferably not more than 5 percent, in the temperature range from the room temperature to the temperature which is higher by 10° C. than the temperature for retaining the melt.

In the first crucible part comprising such properties, on the other hand, the melt may creep up along its inner walls to overflow the same. While the melt surface level is lowered in this case, it is possible to remarkably suppress this phenomenon by the second crucible part, as hereafter described in more concrete terms. When the second crucible part is prepared from a material, particularly MgO, which substantially causes neither melting nor chemical reaction with respect to the melt and can retain the melt (e.g., the melt surface) more stably than the first material, it is possible to effectively suppress movement of the melt. While the mechanism of the action is not clarified, the melt is suppressed from movement and solidified when the raw material which is stored in the first crucible part overflows the same in a melted or semi-melted state to reach the second crucible part. After the melt which is stored in the first crucible part is reduced by a constant volume, thus, the movement of the melt is so suppressed that the volume of the melt is maintained at a constant value while the melt surface is also maintained at a constant level. Further, the second crucible part is provided outside the first crucible part, to be only slightly in contact with the melt. Therefore, the melt is hardly or only slightly contaminated with an impurity from the second crucible part. Thus, the melt is stably retained in a state with no impurity contamination. It is possible to stably prepare an oxide crystal having excellent characteristics, particularly crystallinity, from such a melt by the pulling method.

EXAMPLES

The present method of retaining a melt is now described with reference to the drawings.

Figure 3:
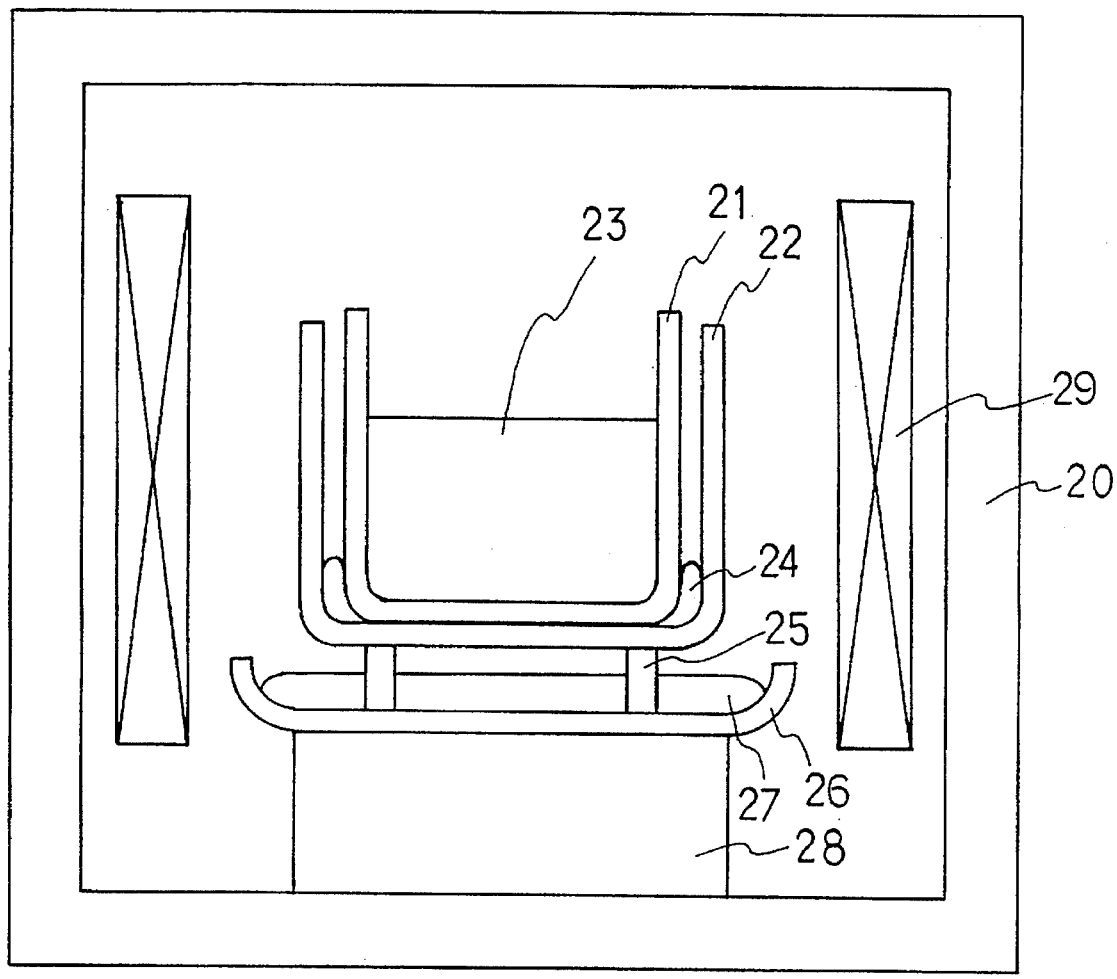
FIG. 3 is a model diagram showing a concrete example of an apparatus for retaining an oxide melt according to the present invention.

FIG. 3 shows a concrete example of an apparatus for carrying out the present method of retaining a melt. In this apparatus, an inner crucible 21 serving as the first crucible part is provided at the center, and held in an outer crucible 22 serving as the second crucible part. An Ag melt 24 is retained between the inner and outer crucibles 21 and 22. Further, the outer crucible 22 is supported by support posts 25 consisting essentially of MgO single crystals. The support posts 25 are placed on an $Al_2O_3$ pan 26, which is placed on a support 28 consisting essentially of a heat insulating material. Further, an Ag melt 27 is stored in the $Al_2O_3$ pan 26. Electric heaters 29 are provided around the outer crucible 22, for maintaining the melt 23 at a prescribed temperature. These elements are enclosed with a heat insulating material 20. In such an apparatus, a raw material is stored in the inner crucible 21, to be retained as a melt 23.

Example 1

In the aforementioned apparatus, a melt containing Y, Ba and Cu in mole ratios of about 1:60:100 was retained as follows: First, yttrium oxide, barium carbonate and copper oxide were mixed with each other so that Y, Ba and Cu were in mole ratios of 1:60:100, and the mixture was calcined at 880° C. for 40 hours. Then, the sintered mixture was introduced into an inner crucible of a $Y_2O_3$ sintered body of 50 mm in inner diameter, 60 mm in outer diameter and 45 mm in depth, and the inner crucible was then introduced into an outer crucible of an MgO sintered body of 65 mm in inner diameter, 75 mm in outer diameter and 45 mm in depth. A small amount of Ag was charged between the inner and outer crucibles. Support posts of MgO single crystals were arranged on an $Al_2O_3$ pan, Ag was introduced into the pan, and the outer crucible was placed on the support posts.

These members were set in a furnace and heated to about 1020° C. by heaters, thereby melting the raw material which was stored in the inner crucible. At this time, Ag was sufficiently melted to provide an Ag vapor atmosphere around the crucibles.

The melt which was retained in this state gradually reacted with the inner crucible and crept up along inner surfaces of the crucible, to overflow the same. While Y was dissolved into the melt from the inner crucible due to this reaction, this Y, the element forming the melt, caused no contamination.

For reference, Table 1 shows Mg concentration values in samples collected from melts which were retained in crucibles of a $Y_2O_3$ sintered body and other materials in comparison with each other. All surface temperatures of the melts, from which the samples were collected, were about 1000° C. It is clearly understood from Table 1 that no contamination from the outer crucible was caused in the sample of the double crucible based on the present invention, and contamination of the melt with Mg was suppressed to a level substantially equivalent to the case of employing only a $Y_2O_3$ sintered body crucible.

TABLE 1

| Mg Concentration in Melts Retained in Various Crucibles | |
|---|---|
| Crucible Material | Mg Concentration in Melt (atm %) |
| $Y_2O_3$ Sintered Body Crucible | trace |
| MgO Sintered Body Crucible | 0.3 |
| MgO Single Crystal Crucible | 0.3 |
| $Y_2O_3$ Sintered Body Inner Crucible/MgO Sintered Body Outer Crucible | 0.017 |

While the melt overflowing the inner crucible came into contact with the outer crucible of the MgO sintered body, the melt was retained without overflowing the outer crucible since MgO hardly reacted with the melt. Consequently, the melt which was stored in the inner crucible was slowly reduced for several to several 10 hours after melting and its liquid level was reduced by several mm from the initial level, while it was possible to thereafter maintain a stable state. The double structure of the inner and outer crucibles can be regarded as having excellent performance as to retention of the melt having this composition.

Figure 4:
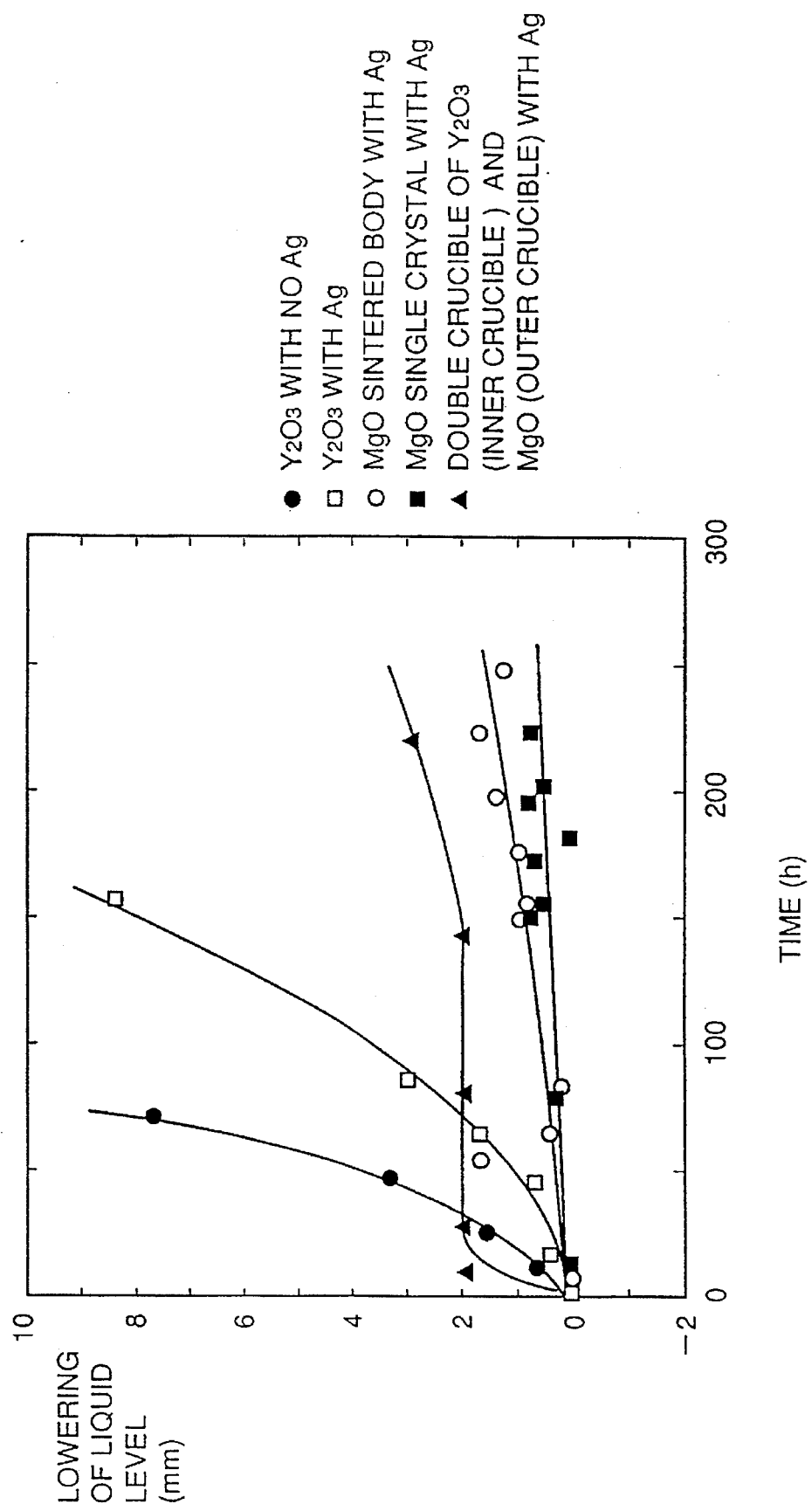
FIG. 4 illustrates changes over time caused in surface levels of BaO—CuO-based melts which were retained in crucibles consisting essentially of various materials.

FIG. 4 illustrates changes over time as to lowering of liquid levels of melts which were retained in the aforementioned double crucible and single crucibles of a $Y_2O_3$ sintered body, an MgO sintered body and an MgO single crystal under an Ag atmosphere respectively. This graph also shows a change over time as to lowering of the liquid level of a melt which was retained only in a crucible of a $Y_2O_3$ sintered body with no Ag. In every case, the inner diameter of the crucible was about 50 mm and the surface temperature of the melt was about 1000° C. It is clearly understood from FIG. 4 that the liquid level is most rapidly lowered when the melt is retained in a single crucible of a $Y_2O_3$ sintered body with no Ag (shown by ●. The melt retention state is improved by employing a single crucible of a $Y_2O_3$ sintered body under an Ag atmosphere (shown by □), but this improvement is insufficient. When a single crucible of an MgO sintered body or an MgO single crystal is employed under an Ag atmosphere (shown by 0 and black square respectively), it is possible to substantially suppress lowering of the liquid level. On the other hand, it is understood that the combination of the inner crucible of a $Y_2O_3$ sintered body and the outer crucible of an MgO sintered body based on the present invention (black triangle) has melt retention ability which is substantially equivalent to that of the single crucible of the MgO sintered body except initial abrupt reduction.

As hereinabove described, an MgO crucible is unpreferable since Mg contaminates the melt as an impurity (see Table 1). In consideration of stable retention of the melt and prevention of impurity contamination in the melt, therefore, the double crucible can be regarded as most excellent.

Example 2

A method of retaining an oxide melt consisting essentially of Sm, Ba, Cu and O is now described in concrete terms. An oxide melt containing Sm, Ba and Cu in mole ratios of about 1:24:40 was retained in an apparatus having a structure similar to that shown in FIG. 3. First, samarium oxide, barium carbonate and copper oxide were mixed with each other so that mole ratios of Sm, Ba and Cu were 1:24:40, and the mixture was calcined at 880° C. for 40 hours. The obtained material was introduced into an inner crucible of an $Sm_2O_3$ sintered body of 50 mm in inner diameter, 60 mm in outer diameter and 45 mm in depth. Then, the inner crucible was introduced into an outer crucible of an MgO sintered body of 65 mm in inner diameter, 75 mm in outer diameter and 45 mm in depth, and a small amount of Ag was charged between the inner and outer crucibles. Crucible support posts of MgO single crystals were arranged on an $Al_2O_3$ pan, Ag was introduced into the pan, and the outer crucible was placed on the support posts. These members were set in a furnace and heated to about 1050° C. by heaters, thereby melting the raw material which was stored in the inner crucible. At this time, Ag was sufficiently melted to provide an Ag vapor atmosphere around the crucibles.

The melt which was retained in this state gradually reacted with the inner crucible and crept up along inner walls of the crucible to overflow the same, while no lowering of the liquid level was thereafter recognized and it was possible to retain the melt in a stable state for about 120 hours. Mg concentration of a sample which was collected from the melt surface was analyzed, to prove that Mg was at a detection limit level and it was possible to substantially completely suppress impurity contamination from the MgO outer crucible. From the aforementioned results, it has been clarified that the combination of the inner crucible consisting essentially of an $Sm_2O_3$ sintered body and the outer crucible consisting essentially of an MgO sintered body has excellent performance in consideration of stable retention of the melt and prevention of impurity contamination.

Example 3

A method of retaining an oxide melt consisting essentially of Pr, Ba and Cu is now described in concrete terms. An oxide melt containing Pr, Ba and Cu in mole ratios of about 1:40:120 was retained in an apparatus having a structure similar to that shown in FIG. 3. First, praseodymium oxide, barium carbonate and copper oxide were mixed with each other so that mole ratios of Pt, Ba and Cu were 1:40:120, and the mixture was calcined at 880° C. for 40 hours. The obtained material was introduced into an inner crucible of a $PrBaO_3$ sintered body of 50 mm in inner diameter, 60 mm in outer diameter and 45 mm in depth, and the inner crucible was then introduced into an outer crucible of an MgO sintered body of 65 mm in inner diameter, 75 mm in outer diameter and 45 mm in depth. A small amount of Ag was charged between the inner and outer crucibles. Support posts of MgO single crystals were arranged on an $Al_2O_3$ pan, Ag was introduced into the pan, and the outer crucible was placed on the support posts. The inner crucible was prepared not from $Pr_2O_3$ but from $PrBaO_3$ since a volume change is caused to break the crucible shape if $Pr_2O_3$ is employed, due to a large change of the oxygen content between the room temperature and 1000° C. No such a structural change is caused in $PrBaO_3$. These members were set in a furnace and heated to about 970° C. by heaters, thereby melting the raw material which was stored in the inner crucible. At this time, Ag was sufficiently melted to provide an Ag vapor atmosphere around the crucibles.

The melt which was retained in this state gradually reacted with the inner crucible and crept up along the crucible inner walls to overflow the same, while no lowering of the liquid level was thereafter recognized and it was possible to retain the melt in a stable state for about 70 hours. Mg concentration of a sample which was collected from the melt surface was analyzed, to prove that Mg was at a detection limit level and it was possible to substantially completely suppress impurity contamination from the MgO outer crucible. From the aforementioned results, it has been clarified that the combination of the inner crucible consisting essentially of a $PrBaO_3$ sintered body and the outer crucible consisting essentially of an MgO sintered body has excellent performance in consideration of stable retention of the melt and prevention of impurity contamination.

In each of Examples 1 to 3, the heating means is not restricted to an electric resistance furnace but another means such as a high frequency heating apparatus may alternatively be employed. The atmosphere in the furnace can be freely selected from the atmosphere, a low oxygen partial pressure atmosphere, a low pressure atmosphere and the like.

A method of preparing an oxide crystal according to the present invention is now described in more concrete terms with reference to the drawings.

Figure 5:
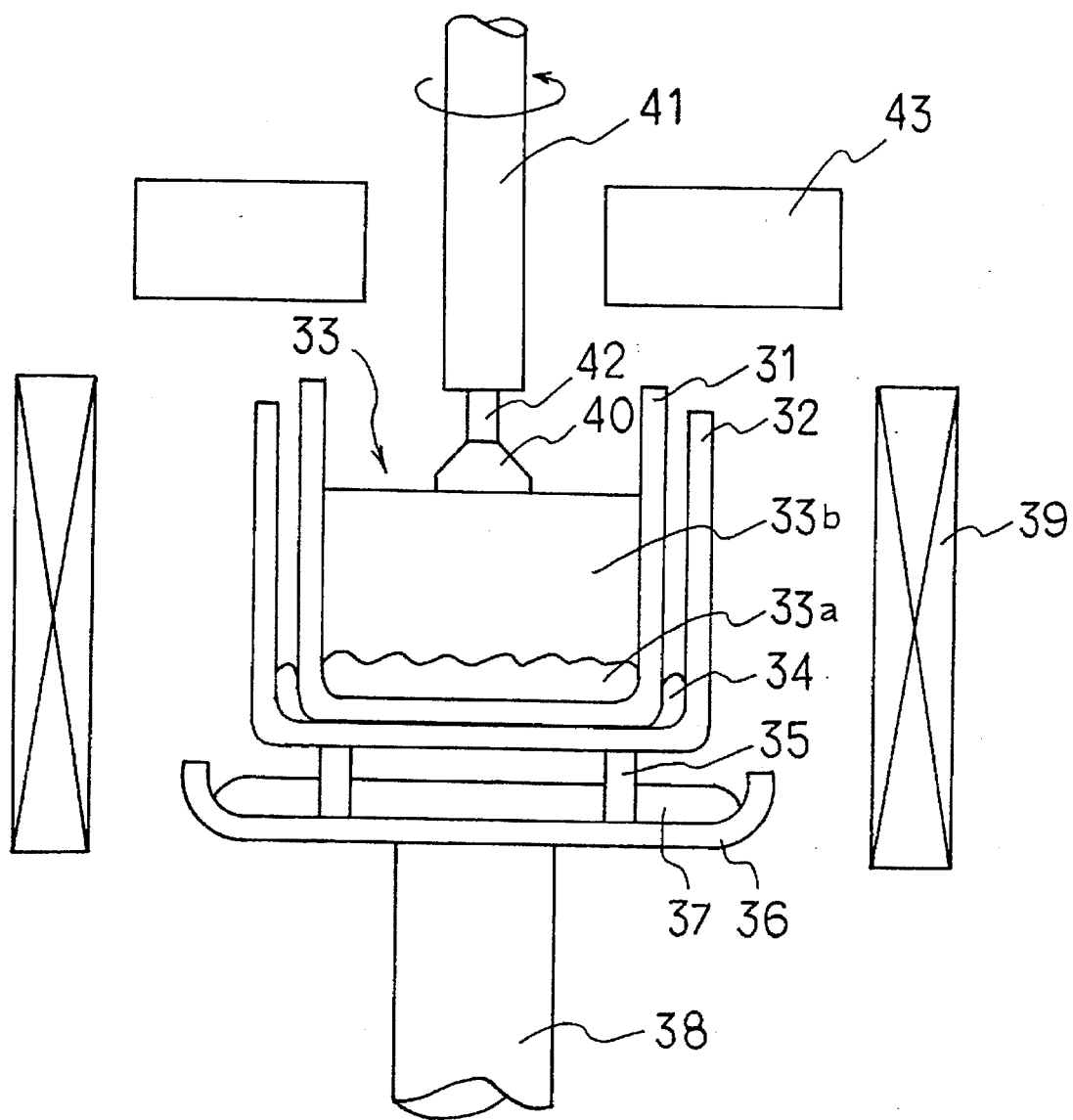
FIG. 5 is a model diagram showing a concrete example of an apparatus for preparing an oxide crystal according to the present invention.
Figure 6:
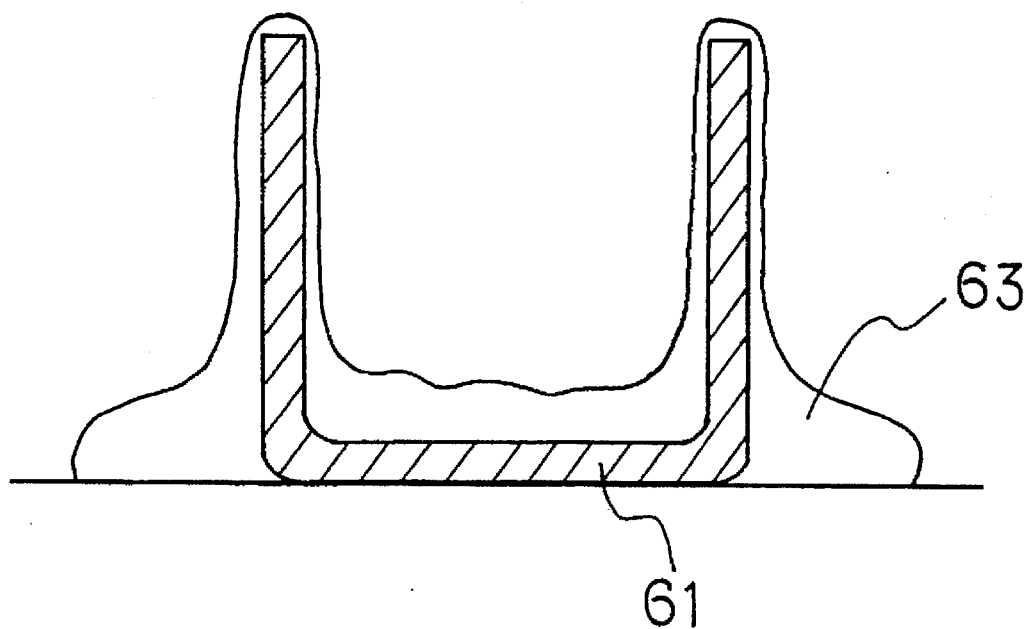
FIG. 6 is a model diagram showing an overflowing state of a melt in a conventional crucible.

FIG. 5 is a model diagram showing a concrete example of an apparatus which is employed for the crystal pulling method according to the present invention. Referring to FIG. 5, a double crucible is provided at the center of the apparatus. The double crucible consists of an inner crucible 31 and an outer crucible 32. An Ag melt 34 is retained between the inner and outer crucibles 31 and 32. The outer crucible 32 is supported by support posts 35 consisting essentially of MgO single crystals, and these support posts 35 are placed on an $Al_2O_3$ pan 36. This pan 36 is provided on a support 38 consisting essentially of a heat insulating material. The $Al_2O_3$ pan 36 also stores an Ag melt 37. Electric heaters 39 are provided around the outer crucible 32, for maintaining the melt 33 at a prescribed temperature. An insulating material 43 is provided also above the double crucible. In this apparatus, a crystal 40 is pulled up from the melt 33, which is stored in the inner crucible 31, by a pulling shaft 41. In such crystal pulling, a seed crystal 42 which is provided on the forward end of the pulling shaft 41 is brought into contact with the melt 33, and thereafter the pulling shaft 41 is rotated to pull up the crystal 40. The melt 33 can be prepared from a solid phase deposit 33a which is a supply source for the element R, and a flux 33b.

Example 4

A Y123 crystal was prepared in the following procedure: First, $Y_2BaCuO_5$ (hereinafter referred to as Y211) serving as a solid phase deposit was introduced into a lower portion of an inner crucible of a $Y_2O_3$ sintered body of 50 mm in inner diameter, 60 mm in outer diameter and 45 mm in depth. Then, a substance prepared by mixing barium carbonate and copper oxide so that Ba and Cu were in a mole ratio of 3:5 and calcining the mixture at 880° C. for 40 hours was introduced on the Y211 as a raw material for a BaO—CuO melt. Then, the inner crucible was introduced into an outer crucible of an MgO sintered body of 65 mm in inner diameter, 75 mm in outer diameter and 45 mm in depth, and a small amount of Ag was charged between the inner and outer crucibles. Support posts of MgO single crystals were arranged on an $Al_2O_3$ pan, Ag was introduced into the pan, and the outer crucible was placed on the support posts. These members were set in a furnace and heated to about 1000° C. by heaters, thereby melting the raw material which was stored in the inner crucible. At this time, Ag was sufficiently melted to provide an Ag vapor atmosphere around the crucibles. The Y211 forming the solid phase deposit on the bottom of the inner crucible was gradually dissolved into the BaO—CuO melt, to provide a melt containing Y, Ba and Cu in mole ratios of about 1:60:100. The melt was retained in this state as described with reference to Example 1. Namely, the melt was stably retained for preparing a crystal, with prevention of impurity contamination.

Then, the surface temperature of the melt was maintained at 980° C. to 1010° C., and a pulling shaft which was provided with a seed crystal on its lower end was rotated at 120 rpm and slowly lowered, to bring the lower end of the seed crystal into contact with the melt surface. Thereafter the pulling shaft was pulled up at a rate of 0.05 to 0.2 mm/h for about 80 hours, whereby it was possible to grow a Y123 crystal of 10 mm square having a length of 8 mm. During such pulling, Y was supplied from the Y211 solid phase into the melt.

Example 5

A method of preparing an $SmBa_2Cu_3O_{7-x}$ ($0 \leq X \leq 1$) (hereinafter referred to as Sm123) crystal is now described in concrete terms. The crystal was prepared by employing an apparatus having a structure similar to that shown in FIG. 5. $Sm_2BaCuO_5$ (hereinafter referred to as Sm211) was employed as a solid phase deposit, and an $Sm_2O_3$ sintered body was employed for an inner crucible. First, Sm211 was introduced into a lower portion of the inner crucible of the $Sm_2O_3$ sintered body of 50 mm in inner diameter, 60 mm in outer diameter and 45 mm in depth. Then, a substance prepared by mixing barium carbonate and copper oxide so that Ba and Cu were in a mole ratio of 3:5 and calcining the mixture at 880° C. for 40 hours was introduced on the Sm211 as a raw material for a BaO—CuO melt. Then, the inner crucible was introduced into an outer crucible of an MgO sintered body of 65 mm in inner diameter, 75 mm in outer diameter and 45 mm in depth, and a small amount of Ag was charged between the inner and outer crucibles. Support posts of MgO single crystals were arranged on an $Al_2O_3$ pan, Ag was introduced into the pan, and the outer crucible was placed on the support posts. These members were set in a furnace and heated to about 1060° C. by heaters, thereby melting the raw material which was stored in the inner crucible. At this time, Ag was sufficiently melted to provide an Ag vapor atmosphere around the crucibles. The Sm211 forming the solid phase deposit on the bottom of the inner crucible was gradually dissolved in the BaO—CuO melt, to provide a melt containing Sm, Ba and Cu in mole ratios of about 1:24:40. It was possible to stably retain the melt in this state, which was most suitable for crystal preparation.

Then, the surface temperature of the melt was maintained at 1040° C. to 1055° C., and a pulling shaft which was provided with a seed crystal on its lower end was rotated at 100 rpm and slowly lowered, to bring the lower end of the seed crystal into contact with the melt surface. Thereafter the pulling shaft was pulled up at a rate of 0.1 to 0.5 mm/h for about 50 hours, whereby it was possible to grow an Sm123 crystal of 15 mm square having a length of 10 mm. Sm was supplied from the Sm211 solid phase into the melt.

Example 6

A method of preparing a $PrBa_2Cu_3O_{7-x}$ ($0 \leq X \leq 1$) (hereinafter referred to as Pr123) crystal is now described in concrete terms. The crystal was prepared in an apparatus having a structure similar to that shown in FIG. 5. $PrBaO_3$ (hereinafter referred to as Pr110) was employed as a solid phase deposit, and a $PrBaO_3$ sintered body was employed for an inner crucible. First, Pr110 was introduced into a lower portion of the inner crucible of the $PrBaO_3$ sintered body of 40 mm in inner diameter, 50 mm in outer diameter and 40 mm in depth. Then, a substance prepared by mixing barium carbonate and copper oxide so that Ba and Cu were in a mole ratio of 1:3 and calcining the mixture at 880° C. for 40 hours was introduced on the Pr110 as a raw material for a BaO—CuO melt. Then, the inner crucible was introduced into an outer crucible of an MgO sintered body of 55 mm in inner diameter, 65 mm in outer diameter and 45 mm in depth, and a small amount of Ag was charged between the inner and outer crucibles. Support posts of MgO single crystals were arranged on an $Al_2O_3$ pan, Ag was introduced into the pan, and the outer crucible was placed on the support posts. These members were set in a furnace and heated to about 1000° C. by heaters, thereby melting the raw material which was stored in the inner crucible. At this time, Ag was sufficiently melted to provide an Ag vapor atmosphere around the crucibles. The Pr110 forming the solid phase deposit on the bottom of the inner crucible was gradually dissolved into the melt, to provide a melt containing Pr, Ba and Cu in mole ratios of about 1:40:120. It was possible to stably retain the melt in this state, which was most suitable for crystal preparation.

Then, the surface temperature of the melt was maintained at 960° C. to 980° C., and a pulling shaft which was provided with a seed crystal on its lower end was rotated at 120 rpm and slowly lowered, to bring the lower end of the seed crystal into contact with the melt surface. Thereafter the pulling shaft was pulled up at a rate of 0.05 to 0.2 mm/h for about 40 hours, whereby it was possible to grow an Pr123 crystal of 7 mm square having a length of 4 mm. Pr was supplied from the Pr110 solid phase into the melt.

In each of Examples 4 to 6, the space between the inner and outer crucibles is properly 1 mm to 10 mm, desirably 2 mm to 5 mm. The outer crucible may be broken due to expansion of the inner crucible etc. if the space is not more than 1 mm, while the volume of the melt flowing out from the inner crucible is so increased that the level of the melt is excessively lowered if the space exceeds 10 mm.

While the rotational frequencies for the pulling shafts were 120 rpm, 100 rpm and 120 rpm in Examples 4, 5 and 6 respectively, these rotational frequencies are not restrictive but an arbitrary rotational frequency can be employed in the range of 5 to 200 rpm. The pulling rate can also be set at an arbitrary level in the range of 0.01 to 0.5 mm/h in every one of Examples 4 to 6. The seed crystal is not restricted to a single crystal of MgO, but can be selected from various ones. It is possible to employ various crystals such as a Y123 single crystal worked in proper plane orientation, an Sm 123 single crystal, a Pr123 single crystal and the like, for example. The heating means is not restricted to an electric resistance furnace but can be prepared from another means such as high frequency heating means. The atmosphere in the furnace can be freely selected from the atmosphere, a low oxygen atmosphere, a low pressure atmosphere and the like.

According to the present invention, as hereinabove described, it is possible to stably retain a melt of an oxide consisting essentially of R (R: yttrium or a lanthanoid element), Ba, Cu and O in a state with no impurity contamination from the crucible. Since the melt can be stably retained in such a manner, it is possible to continuously and stably prepare a crystal having low impurity concentration by the pulling method in crystal growth of an oxide having a structure of $RBa_2Cu_3O_{7-x}$ ($0 \leq X \leq 1$).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of retaining an oxide melt, for retaining an oxide-based melt consisting essentially of R (R: yttrium or a lanthanoid element), barium, copper and oxygen at a melt-retention temperature, said method comprising the steps of:

storing said oxide-based melt in a first crucible part consisting essentially of a first material; and holding said first crucible part in a second crucible part consisting essentially of a second material at least while storing said melt, said first material consisting essentially of a material being an oxide of at least one element selected from the group consisting of said R, barium, copper, having a melting point being higher by at least 10° C. than said melt-retention temperature and causing no structural phase transition in a temperature between the room temperature and a temperature being higher by 10° C. than said melt-retention temperature, said second material consisting essentially of a material causing neither melting nor chemical reaction with respect to said oxide-based melt and being capable of retaining said melt more stably than said first material, movement of said melt being suppressed by said second crucible part.

2. The method in accordance with claim 1, wherein said first material consists essentially of an oxide sintered body of said R.

3. The method in accordance with claim 1, wherein said second material consists essentially of a sintered body or a single crystal of magnesium oxide.

4. The method in accordance with claim 3, wherein bulk density of said second crucible part consisting essentially of said sintered body of magnesium oxide is at least 95 percent.

5. The method in accordance with claim 1, wherein said oxide-based melt consists essentially of yttrium, barium, copper and oxygen, said first material consists essentially of a sintered body of yttrium oxide, and said second material consists essentially of a sintered body of magnesium oxide.

6. The method in accordance with claim 1, wherein said oxide-based melt consists essentially of samarium, barium, copper and oxygen, said first material consists essentially of a sintered body of samarium oxide, and said second material consists essentially of a sintered body of magnesium oxide.

7. The method in accordance with claim 1, wherein said oxide-based melt consists essentially of praseodymium, barium, copper and oxygen, said first material consists essentially of a sintered body of $PrBaO_3$, and said second material consists essentially of a sintered body of magnesium oxide.

8. The method in accordance with claim 1, wherein said first and second crucible parts are independent of each other, said first and second crucible parts being so arranged that the space between an outer side surface of said first crucible part and an inner side surface of said second crucible part is within the range of 1 to 10 mm.

9. The method in accordance with claim 8, wherein a material being selected from the group consisting of silver, a silver alloy and a silver compound is stored between said first and second crucible parts.

10. The method in accordance with claim 1, wherein said melt is retained under an atmosphere containing vapor of a substance being selected from the group consisting of silver, a silver alloy and a silver compound.

11. The method in accordance with claim 1, wherein said second crucible part holding said first crucible part is supported by a member consisting essentially of a sintered body or a single crystal of magnesium oxide.

* * * * *